(12) United States Patent
Zhao et al.

(10) Patent No.: US 11,721,692 B2
(45) Date of Patent: Aug. 8, 2023

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventors: Qiyue Zhao, Zhuhai (CN); Wuhao Gao, Zhuhai (CN); Zu Er Chen, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 210 days.

(21) Appl. No.: 16/969,200

(22) PCT Filed: Jul. 3, 2020

(86) PCT No.: PCT/CN2020/100142
§ 371 (c)(1),
(2) Date: Aug. 12, 2020

(87) PCT Pub. No.: WO2022/000472
PCT Pub. Date: Jan. 6, 2022

(65) Prior Publication Data
US 2022/0005806 A1 Jan. 6, 2022

(51) Int. Cl.
*H01L 29/778* (2006.01)
*H01L 27/085* (2006.01)
(Continued)

(52) U.S. Cl.
CPC ........ *H01L 27/085* (2013.01); *H01L 21/0217* (2013.01); *H01L 21/02164* (2013.01);
(Continued)

(58) Field of Classification Search
CPC ............ H01L 27/0266; H01L 27/0281; H01L 27/0605; H01L 27/095
See application file for complete search history.

(56) References Cited

U.S. PATENT DOCUMENTS

2009/0065810 A1* 3/2009 Honea ................. H01L 27/0605
257/192
2014/0203288 A1* 7/2014 Hsiung .................. H01L 29/51
438/400
(Continued)

FOREIGN PATENT DOCUMENTS

CN 104393045 A 3/2015
CN 108701712 A 10/2018
(Continued)

OTHER PUBLICATIONS

Ujita, S "A Compact GaN-based DC-DC Converter IC with High-Speed Gate Drivers Enabling High Efficiencies" Proc of 26th Int. Symp. On Pow. Semi. Dev. And ICs published 2014, p. 51-54 (Year: 2014).*
(Continued)

*Primary Examiner* — Grant S Withers
(74) *Attorney, Agent, or Firm* — McCoy Russell LLP

(57) ABSTRACT

The present disclosure provides a semiconductor device and a fabrication method thereof. The semiconductor device includes a III-V material layer, a first gate, a second gate, and a first passivation layer. The first gate and the second gate are on the III-V material layer. The first passivation layer is on the first gate. A first activation ratio of an element in the first gate is different from a second activation ratio of the element in the second gate.

13 Claims, 16 Drawing Sheets

(51) Int. Cl.

| | |
|---|---|
| *H01L 21/02* | (2006.01) |
| *H01L 21/8252* | (2006.01) |
| *H01L 23/29* | (2006.01) |
| *H01L 23/31* | (2006.01) |
| *H01L 29/20* | (2006.01) |
| *H01L 29/205* | (2006.01) |
| *H01L 29/66* | (2006.01) |
| *H01L 27/06* | (2006.01) |
| *H01L 27/095* | (2006.01) |

(52) U.S. Cl.
CPC .... *H01L 21/02178* (2013.01); *H01L 21/8252* (2013.01); *H01L 23/291* (2013.01); *H01L 23/3171* (2013.01); *H01L 23/3192* (2013.01); *H01L 27/0605* (2013.01); *H01L 27/095* (2013.01); *H01L 29/2003* (2013.01); *H01L 29/205* (2013.01); *H01L 29/66462* (2013.01); *H01L 29/7786* (2013.01)

(56) References Cited

U.S. PATENT DOCUMENTS

2017/0179272 A1  6/2017  You et al.
2022/0392887 A1* 12/2022  Yanagihara ........... H01L 29/861

FOREIGN PATENT DOCUMENTS

| CN | 110021661 A | 7/2019 |
|---|---|---|
| CN | 110085675 A | 8/2019 |
| CN | 111129008 A | 5/2020 |

OTHER PUBLICATIONS

Sun, R. "GaN Power Integration for High Frequency and High Efficiency Power Applications: A Review" IEEE Access vol. 8, Jan. 17, 2020 pp. 15529-15542 (Year: 2020).*

Li, X. "GaN-on-SoI: Monolithically Integrated AlI—GaN ICs for Power conversion" Feb. 13, 2020 (Year: 2020).*

Tsai, C-L "Smart GaN Platform: Performance and Challenges" 2017 IEEE Int. Elec. Dev. Jan. 25, 2018 pp. 33.1.1-33.1.4 (Year: 2018).*

Chiu, H-C "Low-Mg out-diffusion of a normally off p-GaN gate high-electron-mobility transistor by using the laser activation technique" Mat. Sci. in Semi. Proc. May 14, 2020 pp. 105166-1-105166-5 (Year: 2020).*

International Search Report and Written Opinion of the corresponding PCT application No. PCT/CN2020/100142 dated Apr. 1, 2021.

* cited by examiner

SEMICONDUCTOR DEVICE AND FABRICATION METHOD THEREOF

BACKGROUND

1. Technical Field

The present disclosure relates to a semiconductor device and a fabrication method thereof, and more particularly to a semiconductor device having an element activated in a gate different from in another gate, and a fabrication method thereof.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a III-V material layer, a first gate, a second gate, and a first passivation layer. The first gate and the second gate are disposed on the III-V material layer. The first passivation layer is disposed on the first gate. A first activation ratio of an element in the first gate is different from a second activation ratio of the element in the second gate.

In some embodiments of the present disclosure, a semiconductor device is provided, which includes a III-V material layer, a first doped group III-V layer, a second doped group III-V layer, a first dielectric layer, and a second dielectric layer. The first doped group III-V layer and the second doped group III-V layer are on the III-V material layer. The first dielectric layer is on the first doped group III-V layer. The second dielectric layer is on the second doped group III-V layer. A material of the first dielectric layer is different from a material of the second dielectric layer.

In some embodiments of the present disclosure, a method for manufacturing a semiconductor device is provided. The method includes forming a III-V material layer, and forming a first gate and a second gate on the III-V material layer. The method for manufacturing a semiconductor device further includes forming a first passivation layer on the first gate. A first activation ratio of an element in the first gate is different from a second activation ratio of the element in the second gate after a high-temperature technique.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

PREFERRED EMBODIMENT OF THE PRESENT INVENTION

Figure 1:
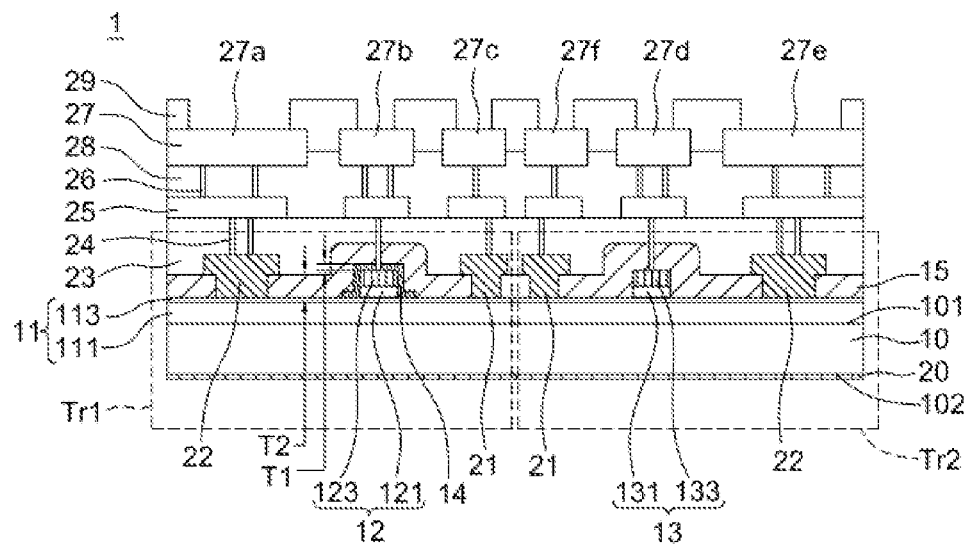
FIG. 1 is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Referring to FIG. 1, which illustrates a cross-sectional view of a semiconductor device 1 according to some embodiments of the present disclosure. The semiconductor device 1 can work in various voltage levels. For example, the semiconductor device 1 can work in a relatively great voltage level (e.g., equal to or greater than approximately 600 V). The semiconductor device 1 can work in various frequency bands. For example, the semiconductor device 1 can work at a relatively high frequency band (e.g., from approximate 1 KHz to approximate 50 GHz).

The semiconductor device 1 includes a substrate 10, a III-V material layer 11, gates 12 and 13, and passivation layers 14 and 15.

The substrate 10 may include, without limitation, silicon (Si), doped Si, silicon carbide (SiC), germanium silicide (SiGe), gallium arsenide (GaAs), sapphire, silicon on insulator (SOI), or other suitable material(s). The substrate 10 may further include a doped region, for example, a p-well, an n-well, or the like. The substrate 10 can include impurity. The substrate 10 can include a p-type silicon substrate.

The III-V material layer 11 may be formed on the substrate 10. The III-V material layer 11 may include a III-nitride layer 111 and a III-nitride layer 113 formed on the III-nitride layer 111.

The III-nitride layer 111 can include, without limitation, a group III nitride, for example, a compound $In_xAl_yGa_{1-x-y}N$, in which $x+y\leq1$. The group III nitride may further include, but is not limited to, for example, a compound $Al_yGa_{(1-y)}N$, in which $y\leq1$. For example, the III-nitride layer 111 can include a GaN layer having a bandgap of about 3.4 eV. The III-nitride layer 111 may be disposed on the substrate 10.

The III-nitride layer 113 may be in direct contact with the III-nitride layer 111. The III-nitride layer 113 can include, without limitation, a group III nitride, for example, a compound $In_xAl_yGa_{1-x-y}N$, in which $x+y\leq1$. The group III nitride may further include, but is not limited to, for example, a compound $Al_yGa_{(1-y)}N$, in which $y\leq1$. For example, the III-nitride layer 113 can include AlGaN having a band gap of about 4 eV.

A heterojunction may be formed between the III-nitride layer 111 and the III-nitride layer 113, e.g., at an interface of the III-nitride layer 111 and the III-nitride layer 113, and the polarization of the heterojunction of different nitrides forms a two-dimensional electron gas (2DEG) region adjacent to the interface of the III-nitride layer 111 and the III-nitride layer 113. The 2DEG region may be formed in the III-nitride layer 111. The III-nitride layer 111 can provide or remove electrons in the 2DEG region, thereby controlling the conduction of the semiconductor device 1. Although it is not illustrated in FIG. 1 for simplification, however, it is contemplated that a super lattice layer can be formed between the substrate 10 and the stack of III-V material layers 11 to facilitate operation of the semiconductor device 1 in a relatively high voltage level.

The gate 12 may be formed on the III-V material layer 11. The gate 12 may include a portion 121 and a portion 123. The portion 121 of the gate 12 may be on the III-V material layer 11, and the portion 123 of the gate 12 may be on the portion 121 of the gate 12.

The portion 121 of the gate 12 may be or include a doped group III-V layer. The portion 121 of the gate 12 may be or include a p-type doped group III-V layer. The portion 121 of the gate 12 may be made of or include an epitaxial p-type III-V material. The portion 121 of the gate 12 may include, for example, but is not limited to, group III nitride, for example, a compound $Al_yGa_{(1-y)}N$, in which $y\leq1$. A material of the portion 121 of the gate 12 may be or include p-type doped GaN. Although it is not illustrated in FIG. 1, however, it is contemplated that the portion 121 of the gate 12 can be eliminated in some other embodiments of the present disclosure. Although it is not illustrated in FIG. 1, however, it is contemplated that the portion 121 of the gate 12 can be eliminated and the portion 123 of the gate 12 is in direct contact with the III-nitride layer 113 in some other embodiments of the present disclosure.

The portion 123 of the gate 12 may include a conductive layer. The portion 123 of the gate 12 may be or include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The 2DEG region may be formed under the portion 121 of the gate 12 and is preset to be in an OFF state when the gate 12 is in a zero-bias state. When a voltage is applied to the gate 12, electrons or charges are induced in the region below the gate 12. When the voltage increases, the number of induced electrons or charges increases as well. Such a device can be referred to as an enhancement-mode device.

The gate 13 may be formed on the III-V material layer 11. The gate 12 and the gate 13 may be disposed at substantially the same elevation.

The gate 13 may include a portion 131 and a portion 133. The portion 131 of the gate 13 may be on the III-V material layer 11. The portion 133 of the gate 13 may be on the portion 131 of the gate 13.

The portion 131 of the gate 13 may be or include a doped group III-V layer. The portion 131 of the gate 13 may be or include a p-type doped group III-V layer. The portion 131 of the gate 13 may be made of or include an epitaxial p-type III-V material. The portion 131 of the gate 13 may include, for example, but is not limited to, group III nitride, for example, a compound $Al_yGa_{(1-y)}N$, in which $y\leq1$. A material of the portion 131 of the gate 13 may be or include p-type doped GaN. Although it is not illustrated in FIG. 1, however, it is contemplated that the portion 131 of the gate 13 can be eliminated in some other embodiments of the present disclosure. Although it is not illustrated in FIG. 1, however, it is contemplated that the portion 131 of the gate 13 can be eliminated and the portion 133 of the gate 13 is in direct contact with the III-nitride layer 113 in some other embodiments of the present disclosure.

The portion 133 of the gate 13 may include a conductive layer. The portion 133 of the gate 13 may be or include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

An activation ratio of an element in the gate 12 may be substantially different from an activation ratio of the element in the gate 13. For example, the gate 12 and the gate 13 can have a p-type dopant, and an activation ratio of p-type dopant in the gate 12 may be substantially different from an activation ratio of the p-type dopant in the gate 13. For example, the gate 12 and the gate 13 can have magnesium (Mg), and an activation ratio of Mg in the gate 12 may be substantially different from an activation ratio of Mg in the gate 13.

The activation ratio of Mg in the gate 12 may range from about 0.130% to about 0.200%. The activation ratio of Mg in the gate 12 may range from about 0.145% to about 0.185%. The activation ratio of Mg in the gate 12 may range from about 0.160% to about 0.170%. The activation ratio of Mg in the gate 13 may range from about 0.130% to about 0.200%. The activation ratio of Mg in the gate 13 may range from about 0.145% to about 0.185%. The activation ratio of Mg in the gate 13 may range from about 0.160% to about 0.170%. The activation ratio of Mg in the gate 12 and the activation ratio of Mg in the gate 13 may be obtained by X-ray photoelectron spectroscopy (XPS) technique. The activation ratio of Mg in the gate 12 and the activation ratio of Mg in the gate 13 may be obtained by electronic energy-loss spectroscopy (EELS) technique. The activation ratio of Mg in the gate 12 and the activation ratio of Mg in the gate 13 may be obtained by low temperature photoluminescence (PL) technique.

The activation ratio difference between the element in the gates 12 and 13 can cause different threshold voltages of the transistor Tr1 (which can included the gate 12 as shown in the left dotted box) and the transistor Tr2 (which can included the gate 13 as shown in the right dotted box). Various transistors (e.g., the transistors Tr1 and Tr2) having different threshold voltages can be manufactured on a same substrate to provide more design option of integrated circuits.

The passivation layer 14 may be disposed on the gate 12. The passivation layer 14 may be disposed on the portion 121 of the gate 12. The passivation layer 14 may be in direct contact with the gate 12. The passivation layer 14 may directly contact the portion 121 of the gate 12. The passivation layer 14 may directly contact the portion 123 of the gate 12. The passivation layer 14 may fully cover the gate 12. The passivation layer 14 may fully cover the portion 121 and the portion 123 of the gate 12.

A thickness T1 of the passivation layer 14 may be equal to or greater than about 40 Å. The thickness T1 of the passivation layer 14 may be from about 40 Å to about 400 Å. The thickness T1 of the passivation layer 14 may range from about 60 Å to about 200 Å. The thickness T1 of the passivation layer 14 may range from about 80 Å to about 140 Å. The passivation layer 14 may include a dielectric layer. The passivation layer 14 may include silicon oxide, silicon nitride, aluminum oxide, aluminum nitride, and a combination thereof.

The passivation layer 15 may be on the gate 13. The passivation layer 15 may directly contacts the gate 13. The passivation layer 15 may directly contact the portion 131 of the gate 13. The passivation layer 15 may directly contact the portion 133 of the gate 13. The passivation layer 15 may directly contact the passivation layer 14. The passivation layer 14 may be disposed between the gate 12 and the passivation layer 15. The passivation layer 15 may cover the passivation layer 14.

The different transistors having different threshold voltages formed on the same substrate can be achieved by adjusting/selecting the materials of the passivation layers, and thus further implantation techniques are not required. Therefore, the manufacturing technique can be simplified, and the manufacturing cost can also be reduced.

The different materials contacting the portion 121 of the gate 12 and the portion 131 of the gate 13 can cause the dopant (e.g., p-type dopant) in the portions 121 and 131 (e.g., p-type doped group III-V layers) to have different activation ratios, thereby the threshold voltages of the gates 12 and 13 may be rendered different. Therefore, the threshold voltages of different transistors on the same substrate may be fined-tuned by adjusting/selecting the materials contacting the doped group III-V layers of the gates of the different transistors. Therefore, the design flexibility of integrated circuits with various voltages is greater as well as more refined without compromising the efficiency and minimized complexity of manufacturing techniques.

The passivation layer 15 may be or include a dielectric layer. The passivation layer 15 may include silicon oxide, silicon nitride, aluminum oxide, aluminum nitride, and a combination thereof. For example, a material of the passivation layer 14 may be different from a material of the passivation layer 15. The passivation layer 14 may be made of or include silicon nitride (e.g., $Si_3N_4$), and the passivation layer 15 may be made of or include silicon oxide (e.g., $SiO_2$). Thereby, the threshold voltage of the gate 12 may be lower than the threshold voltage of the gate 13. For example, the passivation layer 14 may be made of or include silicon oxide (e.g., $SiO_2$), and the passivation layer 15 may be made of or include silicon nitride (e.g., $Si_3N_4$). Thereby, the threshold voltage of the gate 12 may be higher than the threshold voltage of the gate 13.

A thickness T2 of the passivation layer 15 may be equal to or greater than about 400 Å. The thickness T2 of the passivation layer 15 may be from about 400 Å to about 2000 Å. The thickness T2 of the passivation layer 15 may be from about 600 Å to about 1600 Å. The thickness T2 of the passivation layer 15 may be from about 800 Å to about 1200 Å. The thickness T1 of the passivation layer 14 may be smaller than the thickness T2 of the passivation layer 15. A ratio (T2/T1) of the thickness T2 of the passivation layer 15 to the thickness T1 of the passivation layer 14 may be equal to or greater than about 5. A ratio (T2/T1) of the thickness T2 of the passivation layer 15 to the thickness T1 of the passivation layer 14 may be from about 5 to about 20. The ratio (T2/T1) of the thickness T2 of the passivation layer 15 to the thickness T1 of the passivation layer 14 may be from about 6 to about 15. The ratio (T2/T1) of the thickness T2 of the passivation layer 15 to the thickness T1 of the passivation layer 14 may be from about 8 to about 12.

With the design of the thicknesses of the passivation layer 14 and the passivation layer 15, the activation ratios of the element in the gates 12 and 13 may be set at different predetermined values according to actual needs, while the relatively thin passivation layer 14 does not occupy too much vertical space. Thus, the overall thickness of the semiconductor device 1 can remain satisfactorily thin, so as to achieve miniaturization of devices. In addition, the relatively thin passivation layer 14 can provide a relatively less bumpy surface for subsequent layers/structure to be formed thereon.

The semiconductor device 1 may further include electrodes 21 and 22 on the III-V material layer 11. The electrodes 21 and 22 and the gate 12 and 13 may be disposed at substantially the same elevation. The electrode 21 may serve as a source electrode, and the electrodes 22 may serve as drain electrodes. The electrodes 21 and 22 may include, for example, without limitation, a conductor material. The conductor materials may include, but are not limited to, for example, metals, alloys, doped semiconductor materials (e.g., doped crystalline silicon), or other suitable conductor materials.

The semiconductor device 1 may further include interlayer dielectric 23 on the electrodes 21 and 22. The interlayer dielectric 23 may cover the electrodes 21 and 22 and the passivation layer 15. The interlayer dielectric 23 may be spaced apart from the passivation layer 14 by the passivation layer 15. The interlayer dielectric 23 may serve as a planarization layer providing with a substantially planar upper surface for layers/structures formed thereon.

The semiconductor device 1 may further include patterned conductive layers 25 and 27, conductive vias 24 and 26, an intermetallic dielectric 28, and a passivation layer 29. The conductive vias 24 may be formed in the interlayer dielectric 23 and electrically connect the electrodes 21 and 22 to the patterned conductive layer 25. The conductive vias 26 may be formed in the intermetallic dielectric 28 and electrically connect the patterned conductive layer 25 to the patterned conductive layer 27. The patterned conductive layer 27 may include conductive portions 27a, 27b, 27c, 27d, 27e, and 27f. The passivation layer 29 may have openings to respectively expose the conductive portions 27a, 27b, 27c, 27d, 27e, and 27f. The conductive portions 27a and 27e may serve as conductive pads connected to drains. The conductive pads 27b and 27d may serve as conductive pads connected to gates. The conductive pads 27c and 27f may serve as a conductive pad connected to a source.

The semiconductor device 1 may further include a backside metal layer 20. The backside metal layer 20 may be formed on a surface 102 of the substrate 10 opposite the surface 101 on which the III-V material layer 11 is formed. The backside metal layer 20 may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

Table 1 below provides experimental results of some exemplary semiconductor devices (E1 and E2). Each of the exemplary semiconductor devices (E1 and E2) can have a structure same or similar to the semiconductor device 1 as described and illustrated with reference to FIG. 1. The rightmost column of table 1 shows a threshold voltage of a gate in each of the exemplary semiconductor devices (E1 and E2). In table 1, the gate of transistor can includes a p-type doped GaN layer (e.g. the portion 121 or 131 as shown in FIG. 1), and each of the passivation layers directly contacts the corresponding p-type doped GaN layer.

TABLE 1

| | | Passivation layer 14 | | Passivation layer 15 | | Threshold voltage (V) |
|---|---|---|---|---|---|---|
| | | Thickness (Å) | Material | Thickness (Å) | Material | |
| E1 | Gate of transistor Tr1 | 100 Å | Si₃N₄ | NA | NA | 2.5 |
| | Gate of transistor Tr2 | NA | NA | 1000 Å | SiO₂ | 3.2 |
| E2 | Gate of transistor Tr1 | 100 Å | SiO₂ | NA | NA | 1.9 |
| | Gate of transistor Tr2 | NA | NA | 1000 Å | Si₃N₄ | 1.5 |

Table 1 gives some combinations of materials and dimension or size (e.g. thickness) of the passivation layer can result in different threshold voltages. In other words, transistors with various or different threshold voltages can be formed on a same substrate. In other words, transistors with various or different threshold voltages can be integrated as a monolithic structure. Although only four experimental results are given in Table, however, it is contemplated that the material and dimension (e.g. thickness) of the passivation layers can be varied to have a gate threshold voltage of interest. Integration of transistors with various gate threshold voltage in a monolithic structure can facilitate miniaturization. Integration of transistors with various gate threshold voltage in a monolithic structure can provide design flexibility.

Figure 1A:
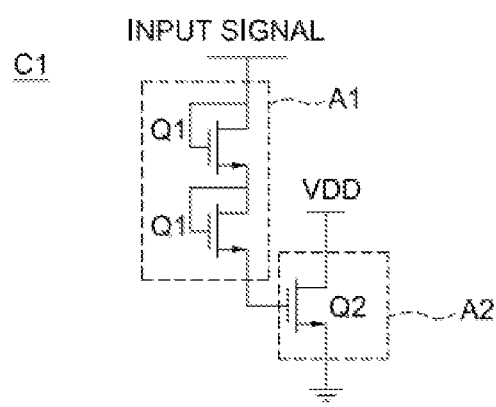
FIG. 1A is a schematic view of a circuit implemented by a semiconductor device according to some embodiments of the present disclosure.

FIG. 1A is a schematic view of a circuit C1 implemented by a semiconductor device according to some embodiments of the present disclosure. The circuit C1 may include transistors Q1 and a transistor Q2. The transistor Q1 and the transistor Q2 may be referred to as the transistor Tr1 and the transistor Tr2 of the semiconductor device according to some embodiments of the present disclosure. The circuit C1 shown in FIG. 1A may include a pull-up portion A1 and a control portion A2. The pull-up portion A1 may receive an input signal and output a signal to the control portion A2. The control portion A2 may be connected to a voltage supply VDD.

The control portion A2 may include a main transistor Q2 with the threshold voltage of 1.5V which requires a pull-up voltage of 4.5V provided by the pull-up portion A1. If transistors in the pull-up portion A1 also have a threshold voltage of 1.5V, it requires three transistors Q1 to provide the pull-up voltage of 4.5V. Nevertheless, if the transistor Q1 has a threshold voltage of 2.25, it only requires 2 transistors Q1 to provide the pull-up voltage of 4.5V. By utilizing transistor(s) with higher threshold voltage in the pull-up portion, the number of transistors can be reduced, and the overall circuit area can be reduced.

Figure 1B:
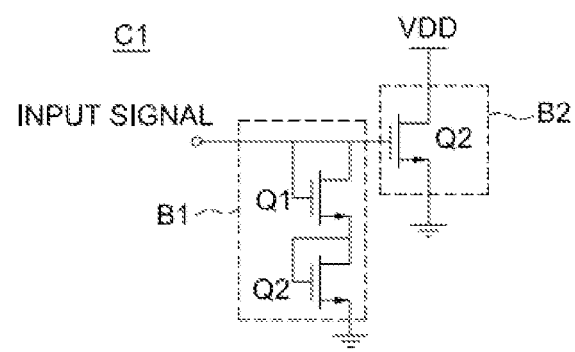
FIG. 1B is a schematic view of a circuit implemented by a semiconductor device according to some embodiments of the present disclosure.

FIG. 1B is a schematic view of a circuit C2 implemented by a semiconductor device according to some embodiments of the present disclosure. The circuit C2 may include transistors Q1 and a transistor Q2. The transistor Q1 and the transistor Q2 may be referred to as the transistor Tr1 and the transistor Tr2 of the semiconductor device according to some embodiments of the present disclosure. The circuit C2 shown in FIG. 1B may include a clamp portion B1 and a control portion B2. The clamp portion B1 may receive an input signal and output a clamp signal to the control portion B2. The control portion B2 may be connected to a voltage supply VDD.

The control portion B2 may include a main transistor Q2 with the threshold voltage of 2V which requires a clamp voltage of 4.5V provided by the clamp portion B1. If transistors in the clamp portion B1 also have a threshold voltage of 2V, the clamp voltage of exact 4.5V cannot be achieved. Nevertheless, if a transistor Q1 with the threshold voltage of 2.5 is connected with a transistor Q2 with the threshold voltage of 2V in serial in the clamp portion B1, the clamp voltage of 4.5 V can be achieved. By utilizing transistor(s) with different threshold voltages in the clamp portion, various clamp voltages can be provided.

By adjusting/selecting the materials of the passivation layers contacting the gates of the different transistors, the threshold voltages of different transistors (e.g., the transistors Q1 and Q2) may be fined-tuned and manufactured on the same substrate. Therefore, the design flexibility of integrated circuits (e.g., the circuits C1 and C2) with various threshold voltages can be greater.

Figure 2:
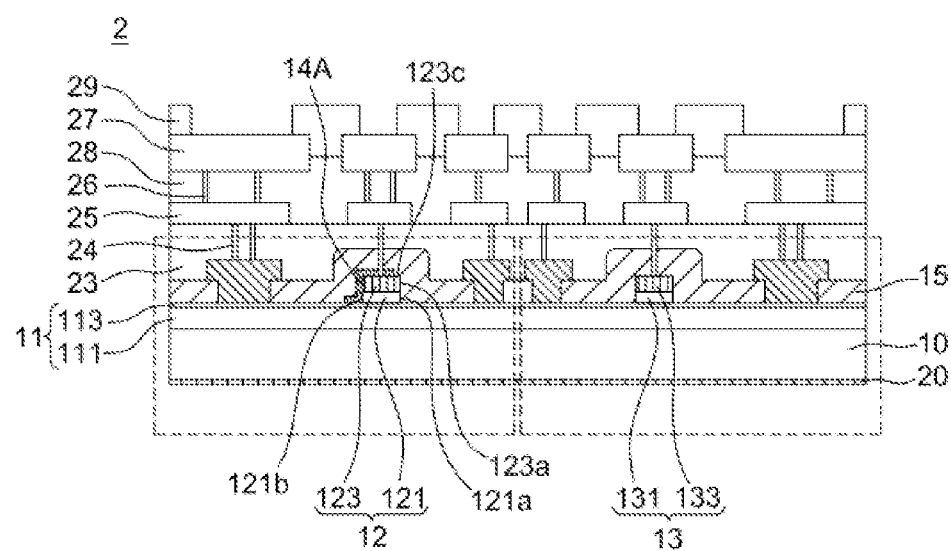
FIG. 2 is a cross-sectional view of a semiconductor device according to some embodiments of the present disclosure.

FIG. 2 is a cross-sectional view of a semiconductor device 2 according to some embodiments of the present disclosure. The semiconductor device 2 has a structure similar to the semiconductor device 1 shown in FIG. 1, except that, for example, the passivation layer 14A has a different structure.

The passivation layer 15 may directly contact the gate 12. The passivation layer 15 may directly contact the portion 121 of the gate 12. The portion 121 of the gate 12 may have a surface 121a (also referred to as "a lateral surface") facing the portion 131 of the gate 13 and a surface 121b (also referred to as "a lateral surface") opposite the surface 121a. The passivation layer 15 may directly contact the surface 121a of the portion 121 of the gate 12. The passivation layer 15 may directly contact the portion 123 of the gate 12. The portion 123 of the gate 12 may have a surface 123a (also referred to as "a lateral surface") facing the portion 131 of the gate 13 and a surface 123c (also referred to as "an upper surface") angled with the surface 123a. The passivation layer 15 may directly contact the surface 123a of the portion 123 of the gate 12. The passivation layer 15 may directly contact the surface 123c of the portion 123 of the gate 12.

The passivation layer 14 may directly contact the surface 121b of the portion 121 of the gate 12. The passivation layer 15 may cover the portion 121 of the gate 12 and the passivation layer 14A.

Figure 3:
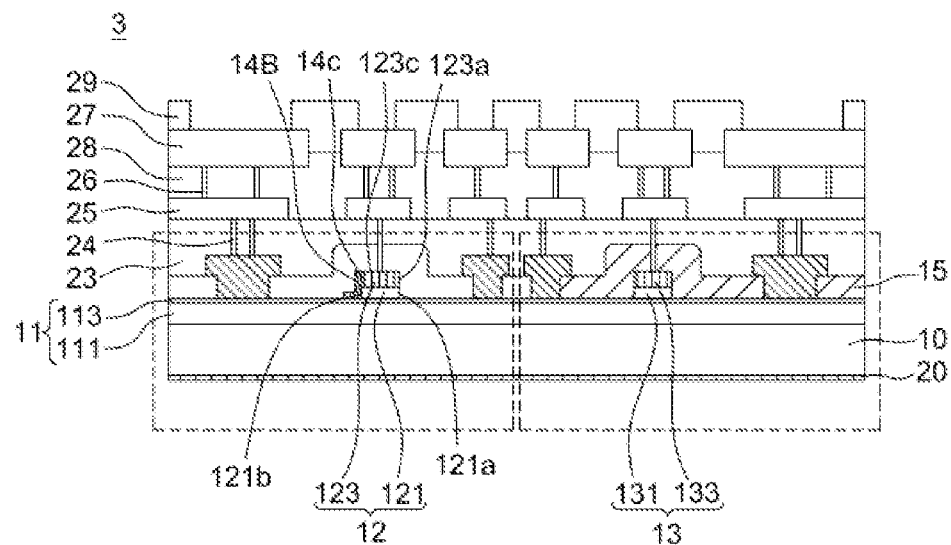
FIG. 3 is a cross-sectional view of a semiconductor device according to some embodiments of the present disclosure.

FIG. 3 is a cross-sectional view of a semiconductor device 3 according to some embodiments of the present disclosure. The semiconductor device 3 has a structure similar to the semiconductor device 1 shown in FIG. 1, except that, for example, the passivation layer 14B has a different structure.

The passivation layer 15 may directly contact the surface 121a of the portion 121 of the gate 12. The passivation layer 15 may directly contact the surface 123a of the portion 123 of the gate 12. The passivation layer 15 may directly contact the surface 123c of the portion 123 of the gate 12. A surface 14c (also referred to as "an upper surface") of the passivation layer 14B may be substantially coplanar with the surface 123c of the portion 123 of the gate 12.

Figure 4:
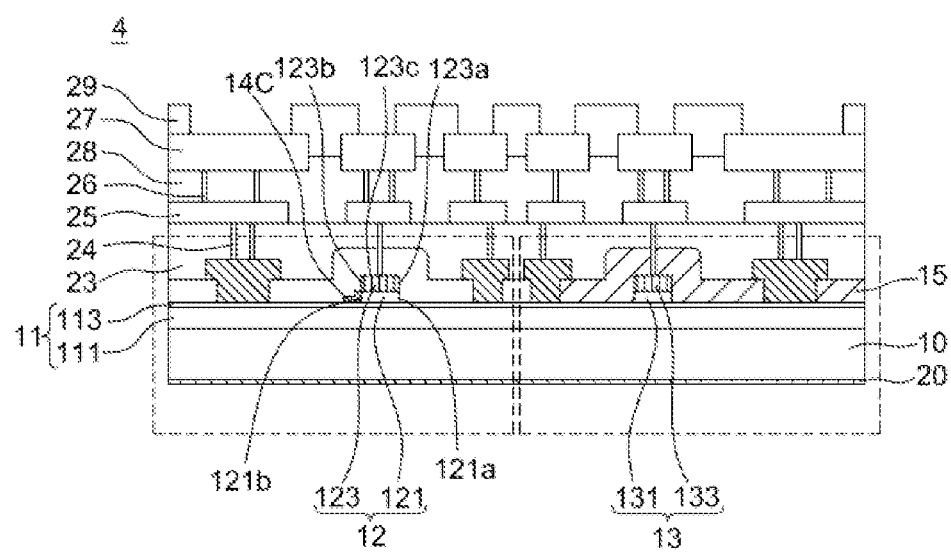
FIG. 4 is a cross-sectional view of a semiconductor device according in to some embodiments of the present disclosure.

FIG. 4 is a cross-sectional view of a semiconductor device 4 according to some embodiments of the present disclosure. The semiconductor device 4 has a structure similar to the semiconductor device 1 shown in FIG. 1, except that, for example, the passivation layer 14C has a different structure.

The portion 123 of the gate 12 may have a surface 123b (also referred to as "a lateral surface") opposite the surface 123a. The passivation layer 15 may directly contact the surface 123b of the portion 123 of the gate 12. The passivation layer 15 may cover the portion 123 of the gate 12.

In some other embodiments, the passivation layer 15 may further directly contact the surface 121b of the portion 121 of the gate 12. The passivation layer 14C may directly cover a portion of the surface 121b of the portion 121 of the gate 12 (not shown in drawings).

Figure 5:
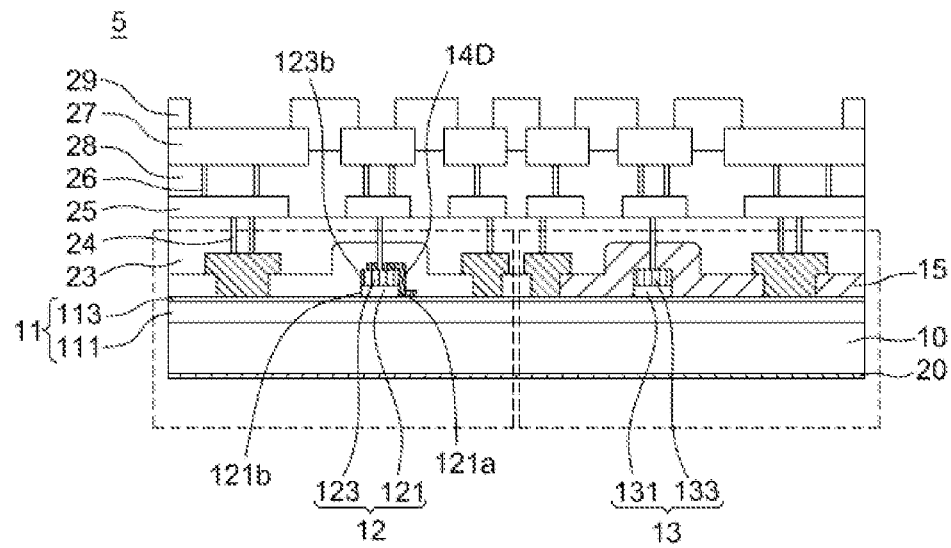
FIG. 5 is a cross-sectional view of a semiconductor device according to some embodiments of the present disclosure.

FIG. 5 is a cross-sectional view of a semiconductor device 5 according to some embodiments of the present disclosure. The semiconductor device 5 has a structure similar to the semiconductor device 1 shown in FIG. 1, except that, for example, the passivation layer 14D has a different structure.

The passivation layer 15 may directly contact the surface 121b of the portion 121 of the gate 12. The passivation layer 15 may directly contact the surface 123b of the portion 123 of the gate 12. The passivation layer 14D may directly contact the surface 121a of the portion 121 of the gate 12. The passivation layer 15 may cover the portion 121 of the gate 12 and the passivation layer 14D.

Figure 6:
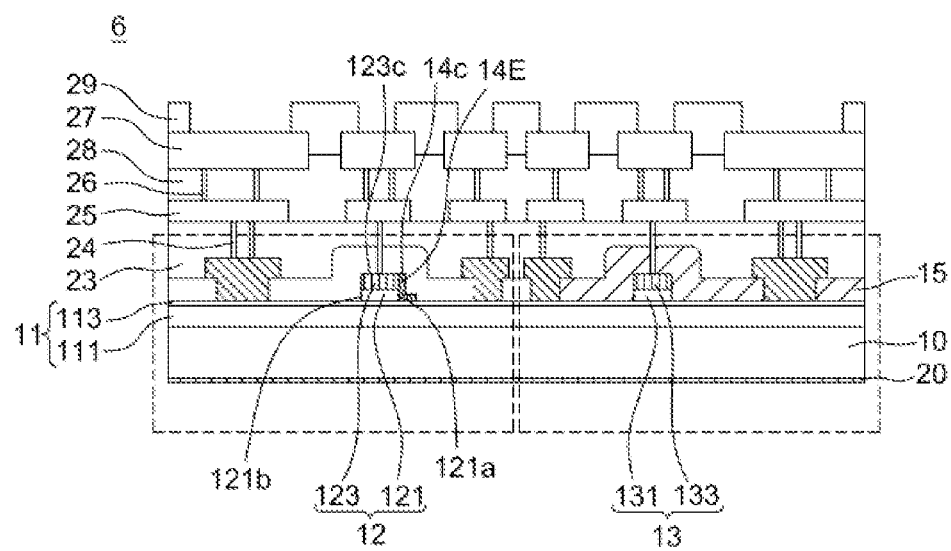
FIG. 6 is a cross-sectional view of a semiconductor device according to some embodiments of the present disclosure.

FIG. 6 is a cross-sectional view of a semiconductor device 6 according to some embodiments of the present disclosure. The semiconductor device 6 has a structure similar to the semiconductor device 1 shown in FIG. 1, except that, for example, the passivation layer 14E has a different structure.

The passivation layer 15 may directly contact the surface 123a of the portion 123 of the gate 12. The passivation layer 15 may directly contact the surface 123c of the portion 123 of the gate 12. The surface 14c (also referred to as "the upper surface") of the passivation layer 14E may be substantially coplanar with the surface 123c of the portion 123 of the gate 12.

Figure 7:
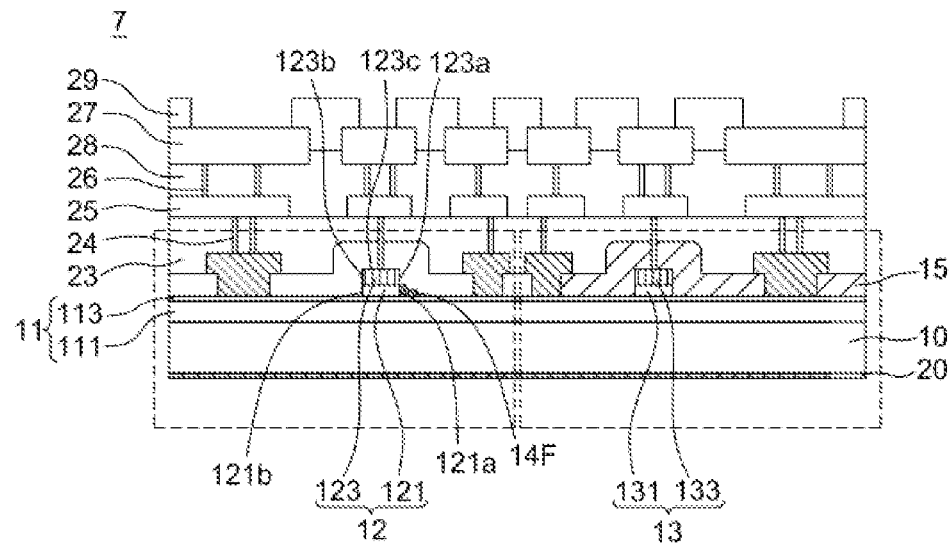
FIG. 7 is a cross-sectional view of a semiconductor device according to some embodiments of the present disclosure.

FIG. 7 is a cross-sectional view of a semiconductor device 7 according to some embodiments of the present disclosure. The semiconductor device 7 has a structure similar to the semiconductor device 1 shown in FIG. 1, except that, for example, the passivation layer 14F has a different structure.

The passivation layer 15 may directly contact the surface 123a of the portion 123 of the gate 12. The passivation layer 15 may cover the portion 123 of the gate 12.

In some other embodiments, the passivation layer 15 may further directly contact the surface 121a of the portion 121 of the gate 12. The passivation layer 14F may directly cover a portion of the surface 121a of the portion 121 of the gate 12 (not shown in drawings).

Figure 8:
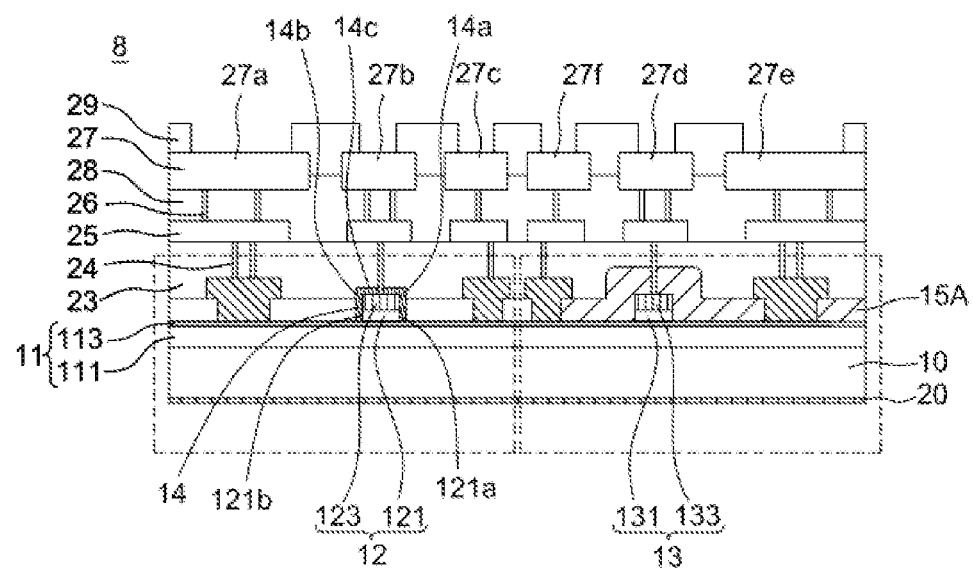
FIG. 8 is a cross-sectional view of a semiconductor device according to some embodiments of the present disclosure.

FIG. 8 is a cross-sectional view of a semiconductor device 8 according to some embodiments of the present disclosure. The semiconductor device 8 has a structure similar to the semiconductor device 1 shown in FIG. 1, except that, for example, the passivation layer 15A has a different structure.

The passivation layer 15A may cover the gate 13 and expose a portion of the passivation layer 14. The surface 14c (also referred to as "the upper surface") of the passivation layer 14 may be exposed from the passivation layer 15A. The surface 14c of the passivation layer 14 may be at a higher elevation than a surface 15c (also referred to as "an upper surface") of the passivation layer 15A. The passivation layer 14 may have a surface 14a (also referred to as "a lateral surface") facing the portion 131 of the gate 13 and a surface 14b (also referred to as "a lateral surface") opposite the surface 14a. The surface 14a and the surface 14b of the passivation layer 14 may be exposed from the passivation layer 15A.

Figure 9:
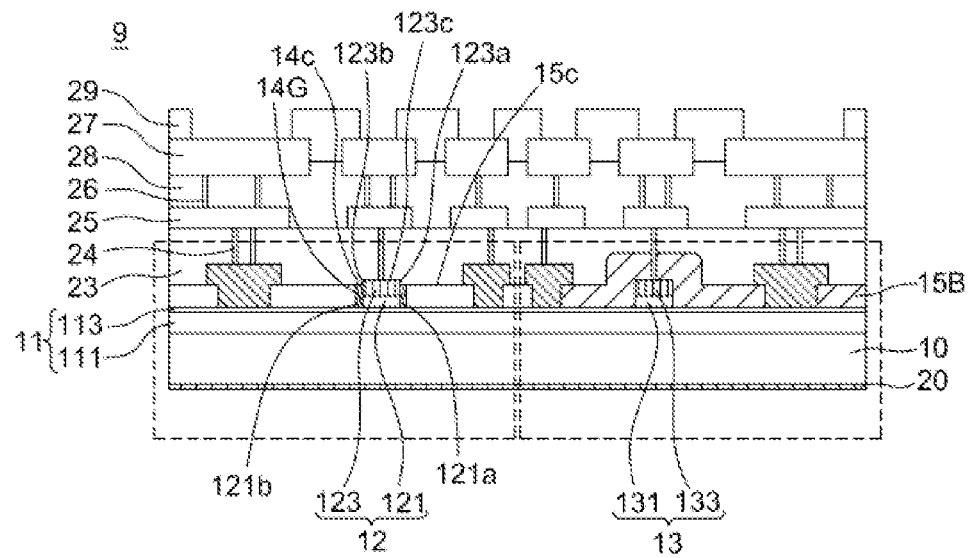
FIG. 9 is a cross-sectional view of a semiconductor device according to some embodiments of the present disclosure.

FIG. 9 is a cross-sectional view of a semiconductor device 9 according to some embodiments of the present disclosure. The semiconductor device 9 has a structure similar to the semiconductor device 1 shown in FIG. 1, except that, for example, the passivation layers 14G and 15B have different structures.

The portion 123 of the gate 12 may be exposed from the passivation layer 15B. The portion 123 of the gate 12 may be exposed from the passivation layer 14G. The surface 14c (also referred to as "the upper surface") of the passivation layer 14G may be substantially coplanar with the surface 15c (also referred to as "the upper surface") of the passivation layer 15B. The surface 14c of the passivation layer 14G may be at a lower elevation than the surface 123c of the portion 123 of the gate 12.

The interlayer dielectric 23 may directly contact the passivation layer 14G. The interlayer dielectric 23 may directly contact the passivation layer 15B.

Figure 10:
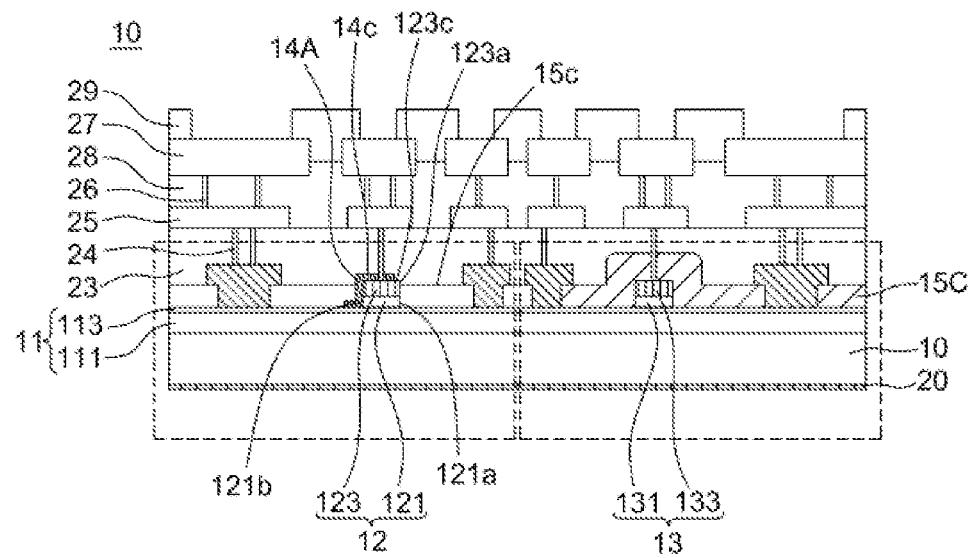
FIG. 10 is a cross-sectional view of a semiconductor device according to some embodiments of the present disclosure.

FIG. 10 is a cross-sectional view of a semiconductor device 10 according to some embodiments of the present disclosure. The semiconductor device 10 has a structure similar to the semiconductor device 2 shown in FIG. 2, except that, for example, the passivation layer 15C has a different structure.

The passivation layer 14A and the portion 123 of the gate 12 may be exposed from the passivation layer 15C. The interlayer dielectric 23 may directly contact the passivation layer 14A and the portion 123 of the gate 12. The interlayer dielectric 23 may directly contact the surface 123a of the portion 123 of the gate 12. The surface 15c of the passivation layer 15C may be at a lower elevation than the surface 123c of the portion 123 of the gate 12. The surface 15c of the passivation layer 15C may be at a lower elevation than the surface 14c of the passivation layer 14A.

Figure 11:
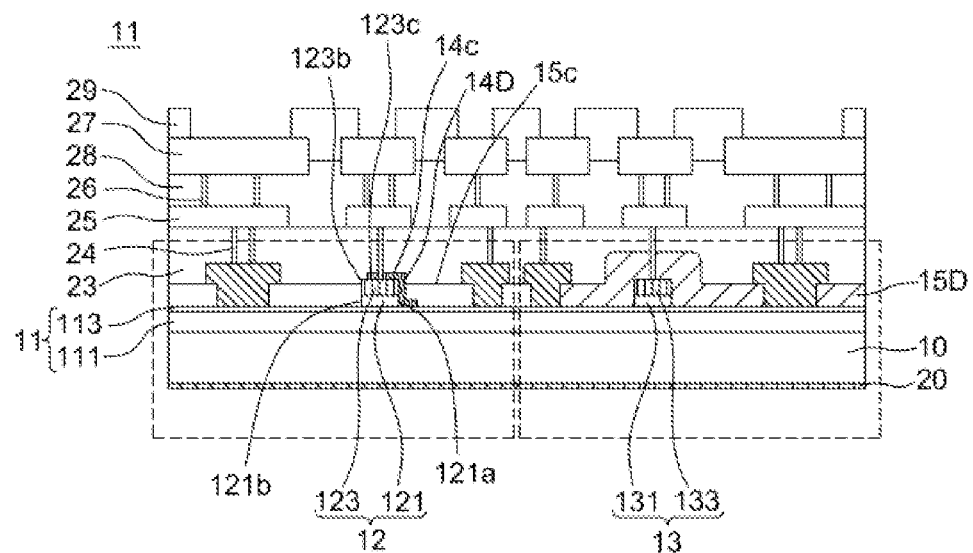
FIG. 11 is a cross-sectional view of a semiconductor device according to some embodiments of the present disclosure.

FIG. 11 is a cross-sectional view of a semiconductor device 11 according to some embodiments of the present disclosure. The semiconductor device 11 has a structure similar to the semiconductor device 5 shown in FIG. 5, except that, for example, the passivation layer 15D has a different structure.

The passivation layer 14D and the portion 123 of the gate 12 may be exposed from the passivation layer 15D. The interlayer dielectric 23 may directly contact the passivation layer 14D and the portion 123 of the gate 12. The interlayer dielectric 23 may directly contact the surface 123b of the portion 123 of the gate 12. The surface 15c of the passivation layer 15D may be at a lower elevation than the surface 123c of the portion 123 of the gate 12. The surface 15c of the passivation layer 15D may be at a lower elevation than the surface 14c of the passivation layer 14D.

FIGS. 12A, 12B, 12C, 12D, 12E, 12F, 12G, 12H, 12I, 12J, 12K and 12L illustrate some operations in manufacturing a semiconductor device according to some embodiments of the present disclosure. Although FIGS. 12A-12L depict several operations for fabricating the semiconductor device 1, similar operations (with some changes for example) can also be used to fabricate the semiconductor device 2, 3, 4, 5, 6, or 7.

Figure 12A:
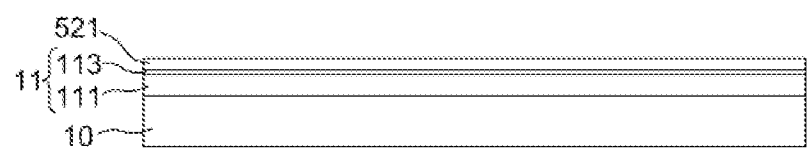
FIGS. 12A, 12B, 12C, 12D, 12E, 12F, 12G, 12H, 12I, 12J, 12K and 12L illustrate several operations in manufacturing a semiconductor device according to some embodiments of the present disclosure.

Referring to FIG. 12A, a III-V material layer 11 may be formed on a substrate 10. A III-nitride layer 111 may be formed on the substrate 10, and a III-nitride layer 113 may be formed on and in direct contact with the III-nitride layer 113. The III-nitride layers 111 and 113 may be formed by epitaxial growth. As a heterojunction can be formed between the III-nitride layer 111 and the III-nitride layer 113, e.g., at an interface of the III-nitride layer 111 and the III-nitride layer 113, a 2DEG region may be formed adjacent to the interface of the III-nitride layer 111 and the III-nitride layer 113.

Still referring to FIG. 12A, a material layer 521 may be formed on the III-nitride layer 113. The material layer 521 may be formed by epitaxy technique. The material layer 521 may be or include a doped group III-V layer. The material layer 521 may be or include a p-type doped group III-V layer. The material layer 521 may be made of or include an epitaxial p-type III-V material. The material layer 521 may include, for example, but is not limited to, group III nitride, for example, a compound $Al_yGa_{(1-y)}N$, in which $y \leq 1$. A material of the material layer 521 may include p-type doped GaN.

Figure 12B:
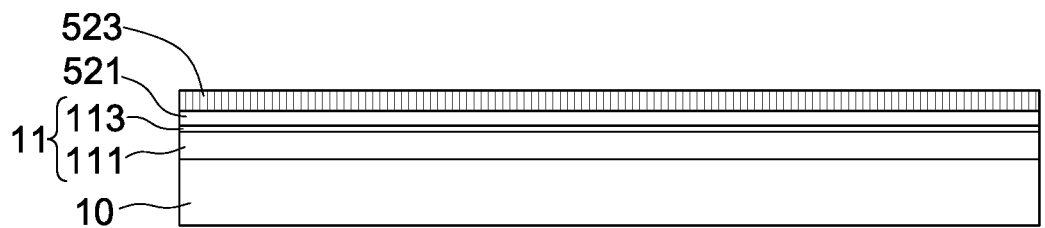

Referring to FIG. 12B, a material layer 523 may be formed on the material layer 521. The material layer 523 may be formed by sputtering technique. The material layer 523 may be or include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

Figure 12C:
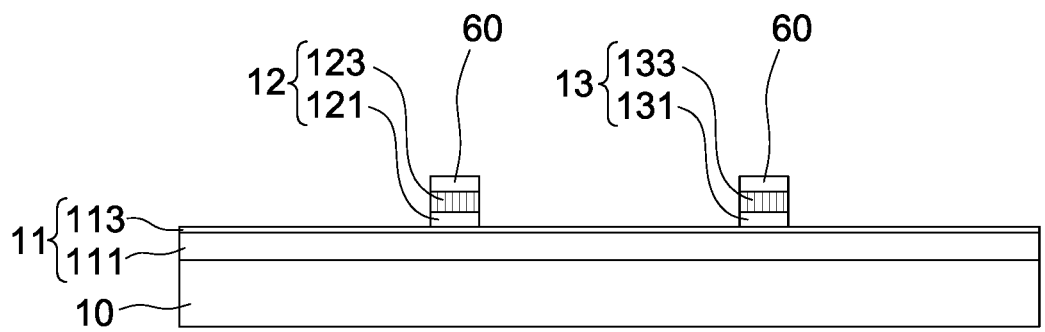

Referring to FIG. 12C, a patterning technique may be performed on the material layer 521 and the material layer 523 to form portions 121 and 123 of a gate 12 and portions 131 and 133 of a gate 13. The patterning technique may be performed by disposing a patterned mask 60 on the material layer 521 and the material layer 523, and etching the material layer 521 and the material layer 523 using the patterned mask 60 as an etch mask to remove a part of the material layer 521 and a part of the material layer 523, so as to form the portions 121 and 123 of the gate 12 and the portions 131 and 133 of the gate 13 on the III-V material layer 11. The patterned mask 60 may be or include a photoresist material.

Figure 12D:
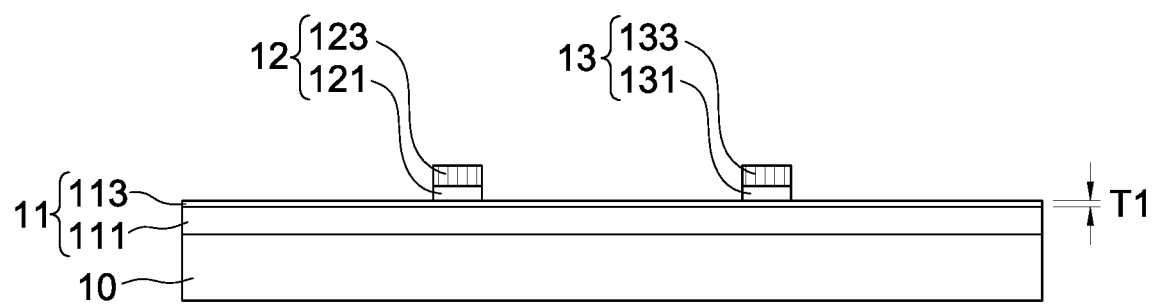

Referring to FIG. 12D, the patterned mask 60 may be removed. The patterned mask 60 may be removed by an etching technique, a stripping technique, a lift-off technique, a dissolution technique, or the like, but the present disclosure is not limited thereto.

Figure 12E:
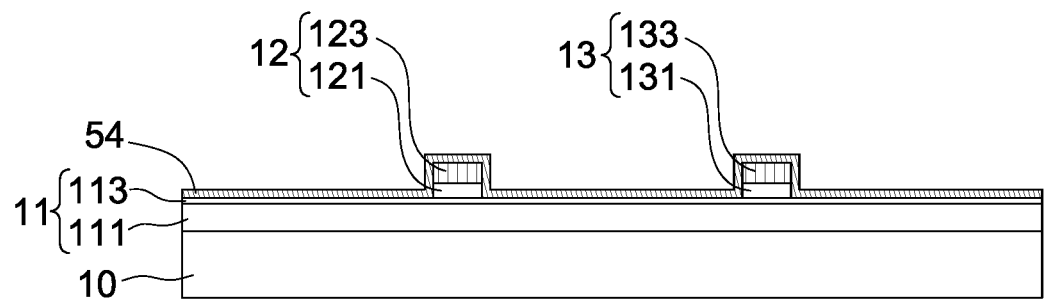

Referring to FIG. 12E, a passivation material 54 may be formed on the gate 12 and the gate 13. The passivation material 54 can be formed by a deposition technique. The passivation material 54 can be formed by a plasma-enhanced chemical vapor deposition (PECVD) technique or a low-pressure CVD (LPCVD) technique. The PECVD technique may be performed under 450° C. or lower. The LPCVD technique may be performed under a temperature from about 400° C. to about 600° C. The passivation material 54 may include silicon oxide, silicon nitride, aluminum oxide, aluminum nitride, and a combination thereof. In some embodiments, the precursor for depositing the passivation material 54 may include $SiH_2Cl_2$, $SiH_4$, TEOS, or a combination thereof. The precursor for depositing the passivation material 54 may include $O_2$, $SiH_4$, or a combination thereof. The precursor for depositing the passivation material 54 may include $N_2O$, $SiH_4$, or a combination thereof. The passivation material 54 may be formed under a relatively low temperature and thus can prevent the structure of the gate 12 from being damaged.

A thickness T1 of the passivation material 54 may be equal to or greater than about 40 Å. The thickness T1 of the passivation material 54 may be from about 40 Å to about 400 Å. The thickness T1 of the passivation material 54 may be from about 60 Å to about 200 Å. The thickness T1 of the passivation material 54 may be from about 80 Å to about 140 Å.

Figure 12F:
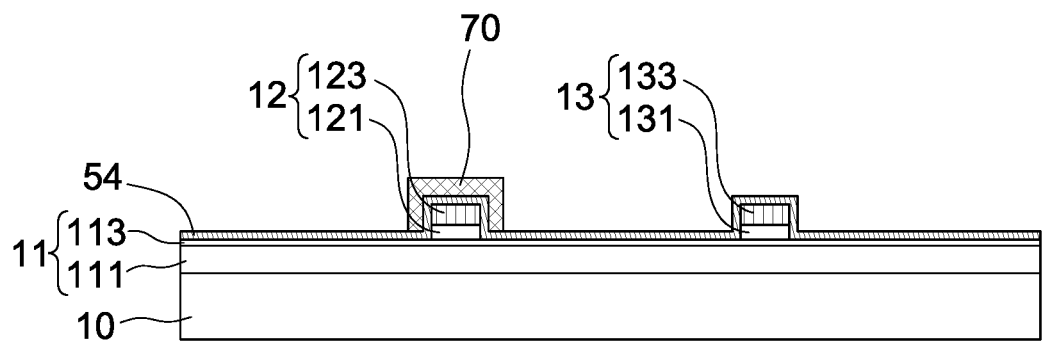

Referring to FIG. 12F, a patterned mask 70 may be formed on the passivation material 54 directly above the gate 12. The patterned mask 70 may fully cover the gate 12 from a top view perspective. The patterned mask 70 may expose the gate 13 from a top view perspective. The patterned mask 70 may be or include a photoresist material.

Figure 12G:
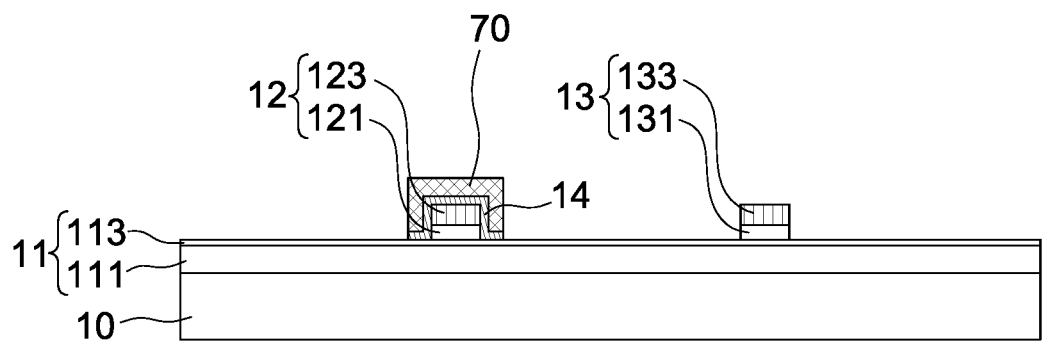

Referring to FIG. 12G, a portion of the passivation material 54 may be removed to expose the gate 13, so as to form the passivation layer 14. The passivation layer 14 may be formed on the gate 12. The passivation layer 14 may be formed by performing an etching technique on the passivation material 54 using the patterned mask 70 as an etch mask. The etching technique may include a dry etch technique, a wet etch technique, or a combination thereof.

In some other embodiments, the patterned mask 70 may be formed on the passivation material 54 and partially cover the gate 12 from a top view perspective. The patterned mask 70 may expose a portion of the gate 12 from a top view perspective. After a portion of the passivation material 54 is removed, a portion of the gate 12 may be exposed from the passivation layer 14A as described and illustrated with reference to FIG. 2. For example, an etching technique may be performed on the passivation material 54 using the patterned mask 70 as an etch mask to form the passivation layer 14A as described and illustrated with reference to FIG. 2.

Figure 12H:
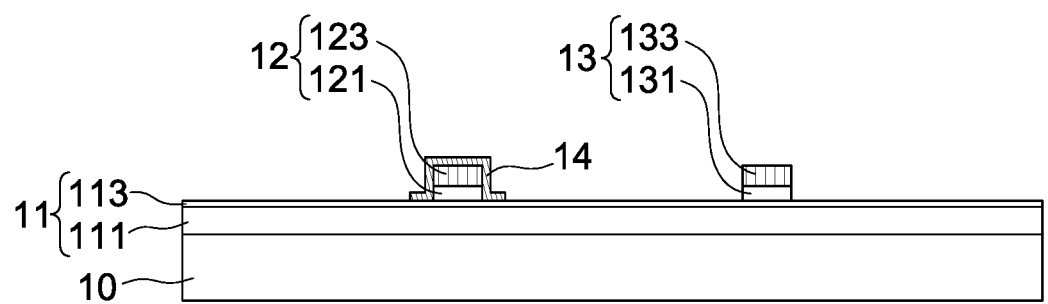

Referring to FIG. 12H, the patterned mask 70 may be removed. The patterned mask 70 may be removed by an etching technique, a stripping technique, a lift-off technique, a dissolution technique, or the like, but the present disclosure is not limited thereto.

Figure 12I:
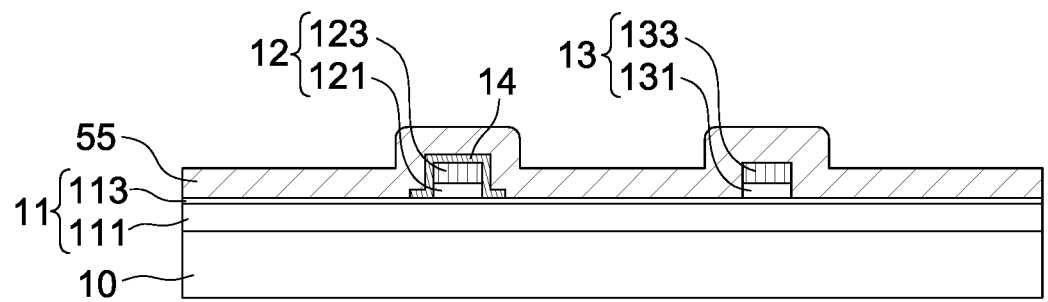

Referring to FIG. 12I, a passivation material 55 may be formed on the passivation layer 14 and covering the gate 13. The passivation material 55 may be formed by a deposition technique. The passivation material 55 may be formed by a plasma-enhanced chemical vapor deposition (PECVD) technique or a low-pressure CVD (LPCVD) technique. The PECVD technique may be performed under 450° C. or lower. The LPCVD technique may be performed under a temperature from about 400° C. to about 600° C. The passivation material 55 may include silicon oxide, silicon nitride, aluminum oxide, aluminum nitride, and a combination thereof. The precursor for depositing the passivation material 55 may include $O_2$, $SiH_4$, or a combination thereof. The precursor for depositing the passivation material 55 may include $N_2O$, $SiH_4$, or a combination thereof. The passivation material 55 may be formed under a relatively low temperature and thus can prevent the structure of the gate 13 from being damaged. The passivation material 55 may cover the gate 12 and the gate 13 from a top view perspective. The passivation material 55 may be different from the passivation material 54.

Figure 12J:
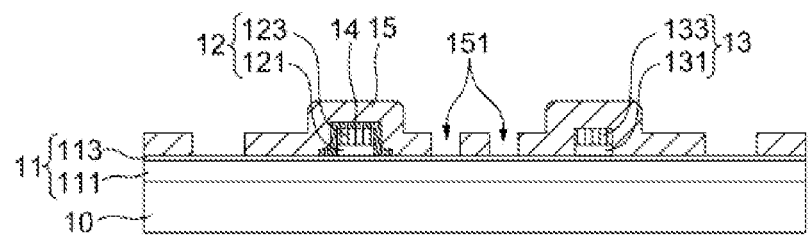

Referring to FIG. 12J, a patterning technique may be performed on the passivation material 55 to form a passivation layer 15 on the gate 13. The passivation layer 15 may have openings 151 (also referred to as "trenches") to expose the III-V material layer 11. The passivation layer 15 may be further formed on the gate 12. A material of the passivation layer 14 may be different from a material of the passivation layer 15.

Figure 12K:
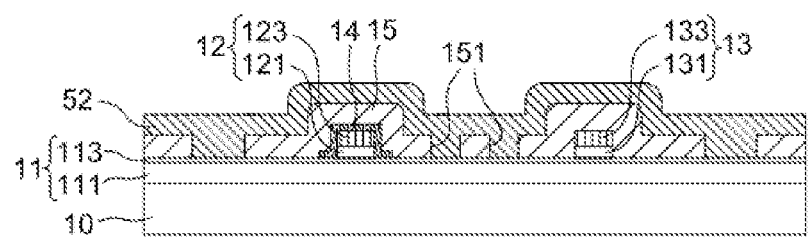

Referring to FIG. 12K, a conductor material layer 52 may be formed on the passivation layer 15 and filled in the openings 151 of the passivation layer 15. The conductor material layer 52 may include, but are not limited to, for example, metals, alloys, doped semiconductor materials (e.g., doped crystalline silicon), or other suitable conductor materials.

Figure 12L:
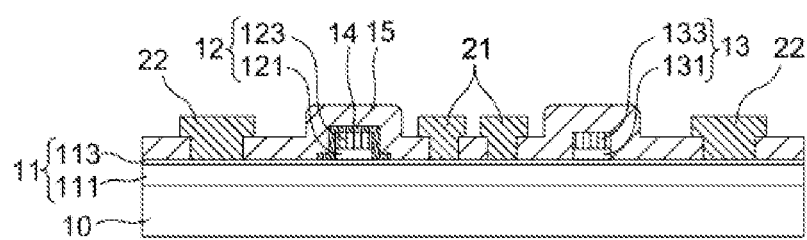

Referring to FIG. 12L, a patterning technique may be performed on the conductor material layer 52 to form electrodes 21 and 22 in the openings 151 of the passivation layer 15.

Next, a heating technique may be performed on the electrodes 21 and 22 to form ohmic contacts between the III-V material layer 11 and the electrodes 21 and 22. The heating technique may include a high-temperature technique. The heating technique may include a rapid thermal annealing (RTA) technique. The RTA technique may be performed under a temperature of about 700° C. to about 900° C. for about 20 seconds to about 40 seconds. The gates 12 and 13 may be also subjected to the heating technique (e.g., a high-temperature technique). The passivation layers 14 and 15 on the gates 12 and 13 may prevent the structures of the gates 12 and 13 from being damaged by the heating technique. The passivation layer 14 (which is in contact with the gate 12) and the passivation layer 15 (which is in contact with the gate 13) can include different materials, which can result in that an activation ratio of an element in the gate 12 may be different from an activation ratio of the element in the gate 13 after a heat operation. Accordingly, the threshold voltage of the transistor including the gate 12 may be different from the transistor including the gate 13.

The portion 121 of the gate 12 and the portion 131 of the gate 13 may both include Mg, and the passivation layer 14 and the passivation layer 15 may include different amount of hydrogen (H). Mg atoms substitute for Ga atoms in the crystal structures of the portion 121 of the gate 12 and the portion 131 of the gate 13 so as to be activated, and these activated Mg atoms in the crystal structures of the gates 12 and 13 can serve as charge carriers (e.g., acceptors). However, Mg atoms also tend to form strong Mg—H bonds to form relatively stable magnesium hydride. The less Mg—H bonds are formed, the higher activation ratio of Mg is generated. After the gates 12 and 13 and the passivation layers 14 and 15 are subjected to the aforesaid high-temperature technique, the different hydrogen amounts may cause Mg to be activated with different activation ratios in the portion 121 of the gate 12 and the portion 131 of the gate 13. As such, the threshold voltage of the transistor including the gate 12 may be different from the transistor including the gate 13.

Next, an interlayer dielectric 23, conductive vias 24, a patterned conductive layer 25, conductive vias 26, a patterned conductive layer 27, an intermetallic dielectric 28 and a passivation layer 29 may be formed to form the semiconductor device 1 as described and illustrated with reference to FIG. 1. By adjusting/selecting the materials of the passivation layers contacting the gates of the different transistors, the threshold voltages of different transistors may be fined tuned to desired values. Therefore, transistors having different threshold voltages can be integrated into one chip or die, the transistors having different threshold voltages do not have to be manufactured on separate substrates and then assembled onto one substrate. Accordingly, the complexity of manufacturing techniques can be reduced.

FIGS. 13A, 13B, 13C, 13D, 13E and 13F illustrates some operations in manufacturing a semiconductor device according to some embodiments of the present disclosure. Although FIGS. 13A-13F depict several operations for fabricating the semiconductor device 8, similar operations can also be used to fabricate the semiconductor device 9, 9A, or 9B.

First, operations illustrated in FIGS. 12A-12D may be performed to form a gate 12 including portions 121 and 123 and a gate 13 including portions 131 and 133 on the III-V material layer 11.

Figure 13A:
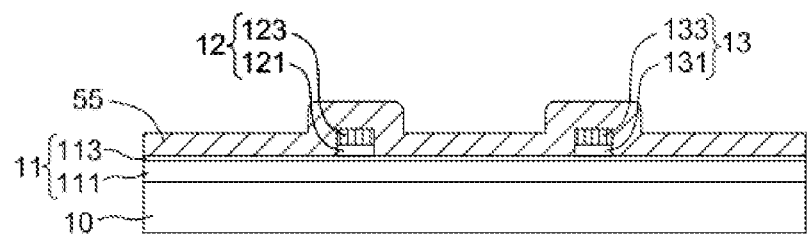
FIGS. 13A, 13B, 13C, 13D, 13E and 13F illustrate an operation in manufacturing a semiconductor device according to some embodiments of the present disclosure.

Then, referring to FIG. 13A, a passivation material 55 may be formed on the gate 12 and the gate 13. The passivation material 55 may be formed by a deposition technique. The passivation material 55 may be formed by a plasma-enhanced chemical vapor deposition (PECVD) technique or a low-pressure CVD (LPCVD) technique. The passivation material 55 may fully cover the gate 12 and the gate 13. The passivation material 55 may be directly formed and contacting the gate 12 and the gate 13.

Figure 13B:
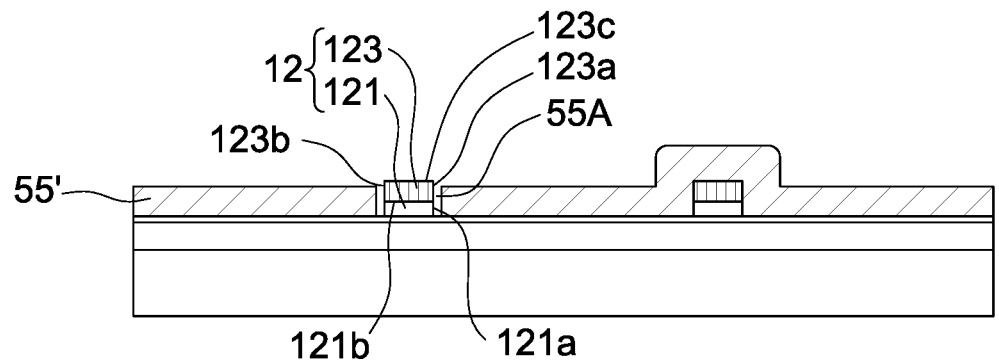

Referring to FIG. 13B, a portion of the passivation material 55 may be removed to expose the gate 12, and the as-formed passivation material 55' on the gate 13. The passivation material 55' may cover the gate 13. The passivation material 55' may be formed by disposing a patterned mask on the passivation material 55 with an opening directly above the gate 12, etching away the portion of the passivation material 55 directly under the opening of the patterned mask, and removing the patterned mask.

Removing the portion of the passivation material 55 may form an opening 55A (also referred to as "a trench") adjacent to the gate 12. The surface 123c (also referred to as "the upper surface") of the portion 123 of the gate 12 may be exposed from the passivation material 55'. The surface 121a (also referred to as "the lateral surface") of the portion 121 of the gate 12 may be exposed to the opening 55A. The surface 121b (also referred to as "the lateral surface") of the portion 121 of the gate 12 may be exposed to the opening 55A. The surface 123a (also referred to as "the lateral surface") of the portion 123 of the gate 12 may be exposed to the opening 55A. The surface 123b (also referred to as "the lateral surface") of the portion 123 of the gate 12 may be exposed to the opening 55A.

Figure 13C:
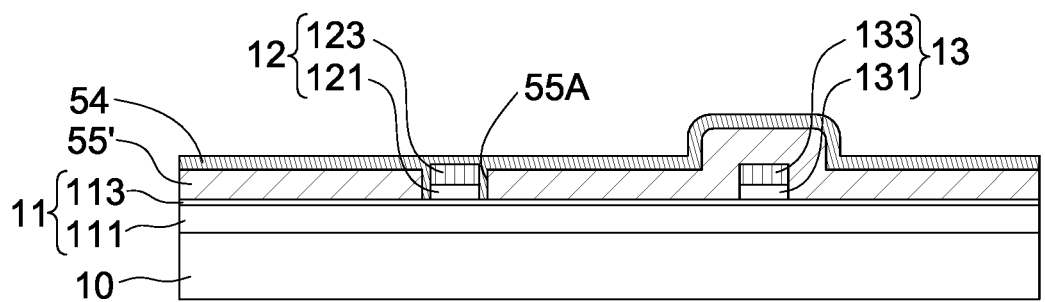

Referring to FIG. 13C, a passivation material 54 may be formed in the opening 55A. The passivation material 54 may be formed on the passivation material 55' and filled in the opening 55A of the passivation material 55'. The passivation material 54 may directly contact the portion 121 of the gate 12.

Figure 13D:
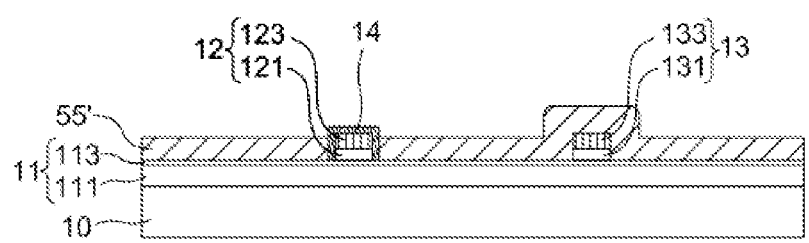

Referring to FIG. 13D, a portion of the passivation material 54 may be removed to form the passivation layer 14 on the gate 12. The passivation layer 14 may cover the gate 12. The passivation layer 14 may be formed by disposing a patterned mask on the passivation material 54 directly above the gate 12, etching away the portion of the passivation material 54 that is not covered by the patterned mask, and removing the patterned mask.

Figure 13E:
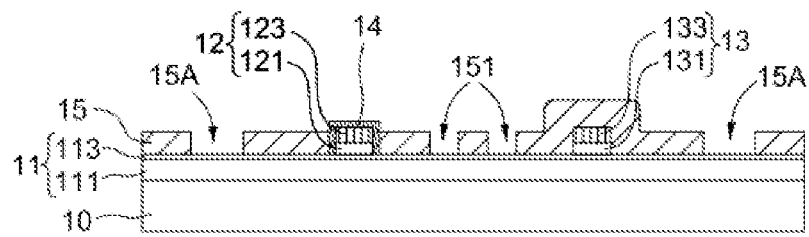

Referring to FIG. 13E, a patterning technique may be performed on the passivation material 55' to form a passivation layer 15 on the gate 13. The passivation layer 15 may have openings 151 (also referred to as "trenches") to expose the III-V material layer 11. A material of the passivation layer 14 may be different from a material of the passivation layer 15. The passivation layer 14 may include silicon oxide, silicon nitride, aluminum oxide, aluminum nitride, and a combination thereof. The passivation layer 15 may include silicon oxide, silicon nitride, aluminum oxide, aluminum nitride, and a combination thereof.

Figure 13F:
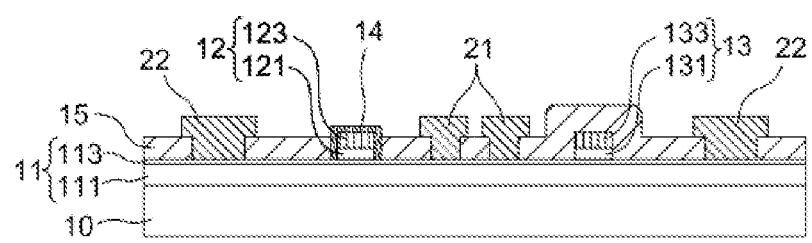

Referring to FIG. 13F, electrodes 21 and 22 may be formed on the passivation layer 15 and filled in the openings 151 of the passivation layer 15. The forming technique and the selections of materials of the electrodes 21 and 22 are similar to those illustrated in FIGS. 12K and 12L, and the details are omitted hereinafter.

Next, a heating technique may be performed on the electrodes 21 and 22 to form ohmic contacts between the III-V material layer 11 and the electrodes 21 and 22. The heating technique may include a high-temperature technique. The heating technique may include a rapid thermal annealing (RTA) technique. The RTA technique may be performed under a temperature of about 700° C. to about 900° C. for about 20 seconds to about 40 seconds. The gates 12 and 13 may be also subjected to the heating technique (e.g., a high-temperature technique). Since the passivation layer 14 contacting the gate 12 and the passivation layer 15 contacting the gate 13 may be made of or include different materials, an activation ratio of an element in the gate 12 may be different from an activation ratio of the element in the gate 13 after a high-temperature technique.

Next, referring to FIG. 8, an interlayer dielectric 23, conductive vias 24, a patterned conductive layer 25, conductive vias 26, a patterned conductive layer 27, an intermetallic dielectric 28 and a passivation layer 29 may be formed to form the semiconductor device 8 shown in FIG. 8.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other techniques and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
a III-V material layer;
a first gate and a second gate on the III-V material layer respectively forming portions of first and second transistors, wherein the first gate comprises a first portion on the III-V material layer and a second portion on the first portion, and the first portion of the first gate comprises a first p-type doped group III-V layer, wherein the second gate comprises a first portion on the III-V material layer and a second portion on the first portion, and the first portion of the second gate comprises a second p-type doped group III-V layer; and
a first passivation layer on the first gate;
wherein a first activation ratio of an element in the first p-type doped group III-V layer of the first gate is different from a second activation ratio of the element in the second p-type doped group III-V layer of the second gate;
wherein the first and second transistors have different threshold voltages.

2. The semiconductor device according to claim 1, wherein the first passivation layer directly contacts the first gate.

3. The semiconductor device according to claim 2, wherein the first passivation layer fully covers the first gate.

4. The semiconductor device according to claim 1, wherein
the first passivation layer directly contacts the first portion of the first gate.

5. The semiconductor device according to claim 1, further comprising:

a second passivation layer on the second gate, wherein a material of the first passivation layer is different from a material of the second passivation layer.

6. The semiconductor device according to claim 5, wherein the second passivation layer directly contacts the second gate.

7. The semiconductor device according to claim 5, wherein the second passivation layer directly contacts the first gate.

8. The semiconductor device according to claim 5, wherein the second passivation layer directly contacts the first passivation layer.

9. The semiconductor device according to claim 5, wherein the second passivation layer covers the first passivation layer.

10. The semiconductor device according to claim 5, wherein the first passivation layer is disposed between the first gate and the second passivation layer.

11. The semiconductor device according to claim 5, wherein
the second passivation layer directly contacts the first portion of the second gate.

12. The semiconductor device according to claim 5, wherein the first passivation layer and the second passivation layer independently comprises silicon oxide, silicon nitride, aluminum oxide, aluminum nitride, or a combination thereof.

13. The semiconductor device according to claim 1, wherein the element is magnesium.

* * * * *